United States Patent [19]

Luo

[11] 4,335,161
[45] Jun. 15, 1982

[54] THIN FILM TRANSISTORS, THIN FILM TRANSISTOR ARRAYS, AND A PROCESS FOR PREPARING THE SAME

[75] Inventor: Fang C. Luo, Pittsford, N.Y.

[73] Assignee: Xerox Corporation, Stamford, Conn.

[21] Appl. No.: 203,218

[22] Filed: Nov. 3, 1980

[51] Int. Cl.³ .......................................... H01L 21/285
[52] U.S. Cl. ........................................ 427/86; 427/87; 427/88; 427/91; 427/99
[58] Field of Search ...................... 427/82, 86, 87, 91, 427/99, 88; 29/571

[56] References Cited

U.S. PATENT DOCUMENTS

| 3,510,349 | 5/1970 | Jones | 427/99 |
| 3,669,661 | 6/1972 | Page et al. | 430/314 |
| 4,040,073 | 8/1977 | Luo | 357/4 |
| 4,042,854 | 8/1977 | Luo | 313/505 |
| 4,086,127 | 8/1977 | Cresswell | 156/643 |

*Primary Examiner*—John D. Smith

[57] ABSTRACT

A process for the preparation of thin film transistors and thin film transistor arrays as described wherein, in a single pump-down, the semiconductive pad, the source electrode, the drain electrode and an insulating layer over the source electrode, drain electrode, and the exposed portion of the semiconductive layer is applied in a single vacuum pump-down by the deposition of the various materials through a shadow mask having openings therein of a size equal to the size of the semiconductive pad to be deposited. The mask is first utilized to deposit the semiconductive pad then moved in a direction and the first conductive electrode is deposited then moved in a direction 180° with respect to the first direction a distance of approximately twice that of the original motion and the second conductor applied by deposition through the openings in the mask. Finally, the remaining portion of the thin film transistors are completed by conventional technology.

6 Claims, 11 Drawing Figures

THIN FILM TRANSISTORS, THIN FILM TRANSISTOR ARRAYS, AND A PROCESS FOR PREPARING THE SAME

BACKGROUND OF THE INVENTION

This invention relates to thin film transistors, thin film transistor arrays and to a method of preparing the same.

It has been known heretofore to utilize thin film transistors and particularly an array of thin film transistors to control and drive display panels such as, for example, liquid crystal displays, electroluminescent mediums, and the like. Thin film transistors in this application offer an attractive substitute to the utilization of silicon technology because of the size limitation problems associated with that technology. A large number of thin film transistors can be prepared within any given size area in a density satisfactory for pictorial presentation. Examples of thin film transistors and associated display panels are set forth in U.S. Pat. Nos. 4,040,073 and 4,042,854.

Fabrication of thin film transistor arrays requires the generation of well-defined geometric patterns of metals, semiconductors and insulators. These are deposited in layers to form the transistor structures and circuit interconnections. Patterns can be generated by shadow masking or photolithographic methods. The first, a popular classic method, relies on a series of mechanical masks to define pattern geometries while shielding the remainder of the substrate from the deposition source. The photolithographic method is attractive for cost effective fabrication of large area circuits containing a high density of components.

It is known by those working in the field of thin film transistors that devices having more suitable characteristics are prepared when the interfaces between the various layers of the thin film transistors are prepared in a single vacuum pump-down. This is especially true of the layers which form the interface with the semiconductive layer of the thin film transistor. It is thought that the reason for this is that a freshly prepared clean surface, when forming the interface with the semiconductive layer, is desirable without being previously subjected to ambient conditions which may result in impurities or some form of degradation occurring to the surface structure. Thus, it is impossible to achieve a thin film transistor by the single pump-down technique where photolithographic techniques are employed in the fabrication of the layers next adjacent to the semiconductive layer. In the past, single pump-down techniques have been employed wherein a multiple number of shadow masks are employed within the vacuum system in order to deposit the proper shape of the different components of the thin film transistor during the single pump-down. This creates many problems because the multiple use of shadow masks has built-in limitations such as high initial capital expenditure, low ultimate panel size, and low resolution of the product. Further, when one shadow mask is moved out of position between the substrate and the source of the material being deposited and a second moved in place, a registration problem employing very close tolerances is present. When it is considered that in a thin film transistor array at least 2500 thin film transistors are prepared per square inch of area, this registration problem is thereby greatly magnified.

It is therefore an object of this invention to provide a method of preparing thin film transistor arrays wherein the various layers are fabricated by a single pump-down technique without the use of multiple shadow mask steps.

| PRIOR ART STATEMENT | | |
|---|---|---|
| F. C. Luo | U.S. Pat. No. 4,040,073 | Aug. 2, 1977 |
| F. C. Luo | U.S. Pat. No. 4,042,854 | Aug. 16, 1977 |
| M. W. Cresswell | U.S. Pat. No. 4,086,127 | Aug. 25, 1978 |
| D. J. Page et al | U.S. Pat. No. 3,669,661 | June 13, 1972 |

Luo U.S. Pat. No. 4,040,073—A double gated thin film field effect transistor in which cadmium selenide is the semiconductor material. A thin layer of indium is provided on either side of the cadmium selenide conducting channel and after annealing enhances the transconductance of the device and reduces trapping of charge in the semiconductor. The source and drain contacts of the device are a combination of an indium layer and a copper layer which improve the performance of the device.

Luo U.S. Pat. No. 4,042,854—A large area integrated solid-state flat panel display is detailed in which thin film transistor addressing and drive circuitry is provided at each individual picture point with a display medium. The preferred display medium is an electroluminescent phosphor layer. An insulating layer of laminated photoresist is disposed over all electrical circuit elements except the electroluminescent drive electrodes.

M. W. Cresswell U.S. Pat. No. 4,086,127—An improved method of fabricating apertured deposition masks is disclosed, with the masks being used in the fabrication of thin film deposited electronic components such as transistors. The masks comprise a core portion with a metal layer provided on a relief side of the core and a metal layer provided on the defining side of the core. The relief side metal layer and the core of the mask are further resist delineated, selectively plated and etched differentially providing a mask preform in which the defining side metal layer is left intact. A narrow width radiation beam is then directed upon closely spaced portions of the defining side metal layer to selectively cut through the defining side metal layer providing the desired space apertures separated by a narrow bridge portion of the defining side metal layer.

Page et al U.S. Pat. No. 3,669,661—A process for producing a thin film transistor comprising, disposing a layer of a spacer material on one surface of a substrate, disposing a layer of a metal on said layer of spacing material, coating at least a portion of said metal layer with a layer of a photoresist material, exposing a pattern on said layer of photoresist material, developing said pattern on said layer of photoresist material, etching said pattern through to said one surface of the substrate, disposing said substrate in a vacuum chamber and sequentially vacuum depositing a plurality of materials through said etched pattern onto said surface of the substrate.

SUMMARY OF THE INVENTION

Accordingly, the invention contemplates a method of preparing a thin film transistor or an array of thin film transistors by depositing in vacuum the semiconductive pads and the source and drain connections thereto through a single aperture mask wherein the aperture mask is moved in a predetermined pattern for the deposition of each of the above-mentioned elements. That is, a substrate is positioned in a vacuum system which is then pumped down to a suitable vacuum, and a shadow mask having a plurality of openings therein in spaced relationship in accordance with the array of thin film transistors to be prepared is disposed between the substrate and the source of materials to be deposited thereon. The shadow mask has openings therein commensurate in size, shape and relative position of the semiconductor pads to be deposited therethrough. The semiconductive material is deposited through the mask, then the mask is moved in a first direction a distance of about ⅜ to about ⅝ the longest dimension of the openings in the mask. A conducting material is deposited through the openings in the mask to fabricate an electrical contact onto the semiconductive material previously deposited. This may form either the source or the drain connection to the semiconductive pad. Next, the aperture mask is moved a distance of twice the original distance of movement, in a direction 180° with respect to the first direction of movement and a third deposition is conducted, again of a conductive material. This forms the remaining electrical connection to the semiconductive pad, which will be either the source or drain electrode. Subsequent to this, an insulating layer is deposited at least over the entire exposed area of the semiconducting material. This can be accomplished by moving the substrate away from the mask and depositing the insulating material through the openings in the aperture mask which has been moved back to its original position with respect to the original position of the substrate. This relative position of the mask with the substrate provides a penumbra effect whereby the area of the insulating material deposited is somewhat larger than the opening in the shadow mask. Also, the insulating material may be deposited over the entire surface of the substrate as previously formed. Unwanted areas of insulating material can be subsequently removed. The assembly as thus described can then be removed from the vacuum and the fabrication completed by techniques such as photolithography and the like known in the art to prepare the various remaining elements of the thin film transistor.

BRIEF DESCRIPTION OF THE DRAWINGS

Other objects and advantages of the present invention will become apparent from the following description with reference to the accompanying drawings, in which.

DETAILED DESCRIPTION OF THE INVENTION

Figure 1:
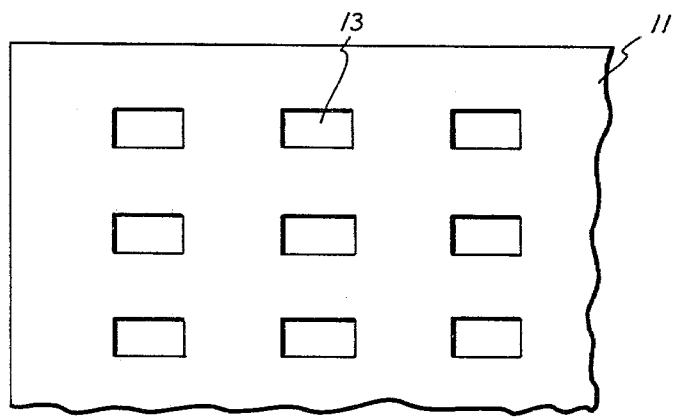
FIG. 1 is a schematic illustration of a portion of a suitable shadow mask for use in the process of this invention.

For a general understanding of the invention, reference is had to the drawings in which like reference characters have been used throughout to indicate like parts. As indicated above, the invention contemplates the use of a single mask which is used for the deposition of the semiconductor pads and the source and drain contacts. A suitable mask for this purpose is shown in FIG. 1. The mask 11 can be made of any suitable material such as, for example, copper, beryllium, tantalum, aluminum, nickel, suitable alloys of any of the above, and the like.

The mask shown in FIG. 1 is designed to fabricate an array of 2500 thin film transistors per square inch, that is, in a single line one inch long, 50 openings 13 are present. In the particular mask shown to prepare an array as indicated above, each opening has a long dimension (length) of 3 mils while the short dimension (height) is 1 mil. The distance between openings is 20 mils center-to-center. Of course, it should be understood that the particular dimensions of the openings in the mask and the distance between openings depends on the desired number of thin film transistors per linear inch. Further, while the openings 13 in the mask shown in FIG. 1 are shown as rectangles, any suitable configuration may be employed such as squares, triangles, circles, and the like.

The mask is positioned within a vacuum chamber in a manner such that it can be moved between the source of a given material for deposition and a substrate. Apparatus suitable for the deposition of thin films in vacuum are well known in the art. Further, the mechanisms for moving masks into the desired location between a substrate and a source are also known in the art.

Figure 2:
FIGS. 2, 3 and 4 represent cross-sectional configurations of suitable substrates for use as the starting point for conducting the process in accordance with this invention.

In accordance with this invention, a suitable substrate is disposed within a vacuum chamber for receiving the deposition of evaporated or sputtered films. FIG. 2 shows a suitable substrate 15 which may be made of any material such as those known in this art as substrates including, for example, glass, metallic material such aluminum, copper, gold, silver and the like, ceramics, plastic materials such as polymethylmethacrylate, polyesters, polycarbonates, polyvinyl polymers, and the like. The semiconductive pads 21 shown in FIG. 4A are deposited through the openings 13 in mask 11 by any suitable techniques such as evaporation, sputtering or the like, onto a surface of the substrate. For example, the semiconductive pads 21 can be deposited directly onto the substrate material as shown in FIG. 2. In an alternate embodiment illustrated in FIG. 3, an insulating layer 17 such as, for example, aluminum oxide, silicon monoxide, silicon dioxide, calcium fluoride, magnesium fluoride and the like, may be first deposited in vacuum onto the substrate 15. In this embodiment, the substrate 15 may be either insulating or conducting since the insulating layer 17 will isolate the semiconductive pads from each other. Further, the semiconductive pads 21 shown in FIG. 4A may be deposited onto a structure as illustrated in FIG. 4 wherein the substrate 15 has initially deposited thereon a conductive film 19 which in turn has deposited thereon an insulating layer 17. The conductive layer 19 may be any suitable material such as, for example, copper, silver, gold, platinum, aluminum and the like. This configuration can be formed within the same vacuum for the preparation of the semiconductive pads by initially depositing a conductive metal onto the substrate material 15 and then depositing onto the conductive metal the insulative layer 17, as described previously with respect to FIG. 3.

Should the semiconductive layer be deposited directly onto the substrate 15 as shown in FIG. 2, the substrate 15 cannot be a conductive material but must be insulating in order to isolate the various semiconductive pads from each other. Further, it may be desirable to take suitable precautions to prepare the surface of the substrate 15 prior to the deposition of the semiconductive pads in order to provide a clean surface which has not been exposed to atmospheric conditions. Suitable techniques to provide a new surface are plasma etching, ion milling and the like. An advantage of the configuration of FIG. 4 is that it inherently permits the ready adaptation of the device to also include a capacitor within each of the thin film transistor circuits fabricated.

Figure 3:
Figure 4:
Figure 4A:
FIGS. 4A through 4C are schematic illustrations of the appearance of a suitable substrate as shown in FIG. 4 being processed in accordance with this invention.

An alternate procedure within the contemplated scope of this invention is for any of the structures of FIGS. 2 through 4 to be prepared initially by suitable techniques such as evaporation, sputtering, electroplating or the like and then placed in the vacuum chamber for processing in accordance with this invention. Rather than treating the surface, by the techniques stated above to produce a new surface, a thin layer of an insulating material is deposited through the shadow mask in the initial position to provide insulating pads having the same dimensions as the semiconductive pads 21 shown in FIG. 4A. The semiconductive pads 21 are next deposited through the mask 11, while in the same position. The insulating pads may be fabricated from any suitable material such as those mentioned above and having a thickness sufficient to provide a new surface onto which the semiconductor is deposited, such as from about 200 to 2,000 Angstroms.

It should be understood that throughout the remainder of the specification, the configuration shown in FIG. 4 is both discussed and shown in the drawings, however, the configurations of either FIGS. 2 and 3 may be employed in place of that of FIG. 4 as the starting point for practicing the process in accordance with this invention. That is, where the semiconductor pads 21 are deposited on insulating layer 17 of FIG. 4 to result in a configuration as shown in FIG. 4A, the semiconductor pads can be directly deposited either onto the substrate 15 or onto an insulating layer 17 which has been deposited onto substrate layer 15 as shown in FIG. 3.

In accordance with the process of this invention, the substrate 15 is carefully cleaned by suitable techniques known in the art, such as degreasing, washing, rinsing and the like, and inserted into the vacuum chamber equipped with a means for moving shadow masks into and out of position between the source of the material to be deposited and the substrate. Such equipment is known in the art and requires no further explanation here. Any suitable means of applying the various films throughout this procedure in the vacuum may be employed such as, for example, evaporating, sputtering and the like.

The vacuum chamber is then pumped down to a pressure less than $10^{-5}$ torr and preferably less than $10^{-7}$ torr and a uniform conductive layer 19 is deposited over the substrate 15. After this deposition, a layer of an insulating material 17 is uniformly deposited over the conductive layer 19. At this point, either the vacuum is broken and the mask 11 inserted or if a more sophisticated vacuum system is used, the shadow mask 11, as shown in FIG. 1, is merely moved into position between the source of the material to be deposited and the substrate 15 containing previously deposited layers 19 and 17. Where the vacuum is broken, it is preferred to first deposit pads of insulating material through the mask to provide new surfaces to engage the semiconductive material 12. Suitable vacuum apparatus of both types are available commercially. A semiconductive material, such as, for example, cadmium selenium, tellurium, cadmium sulfide, silicon, indium arsenide, gallium arsenide, tin oxide, lead telluride, and the like, is deposited onto layer 17 through the openings 13 in shadow mask 11 to prepare a configuration as shown in FIG. 4A wherein discrete areas 21 of semiconductive material are disposed fashion on insulating layer 17. The thickness of the semiconductive pads deposited in this manner are generally from about about 70 to about 1,000 Angstroms and preferably from about 70 to about 120 Angstroms.

Figure 4B:
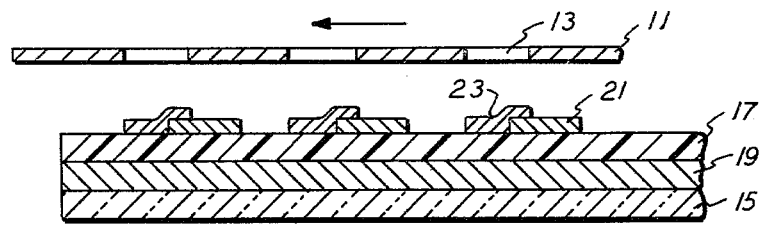

In the next step of the procedure, the shadow mask 11 is moved a distance of from about ⅜ to about ⅞ and preferably from about ½ to about 5/6 of the longest dimension of the openings 13 therein as shown in FIG. 4B. A conductive material, such as, for example, aluminum, copper, gold, silver, chromium, indium, nickel, a combination of any of these materials such as, for example, a chromium-gold-indium composition or a number of layers of different conductive materials such as, for example, an initial layer of indium overcoated with a gold layer, is deposited through the openings 13 in the mask 11 while in this position. This deposition forms an electrical contact 23 to the semiconductive pads 21 which may be utilized as either the source or drain contact. This conductive contact is deposited to a thickness generally of from about 500 to about 2,000 Angstroms and preferably from about 800 to about 1,200 Angstroms. When different layers are deposited, for example, when a first layer of indium and a layer of gold is deposited over the indium layer, the first layer generally will have a thickness of from about 50 to about 300 and the second from about 800 to about 1,200 Angstroms.

Figure 4C:
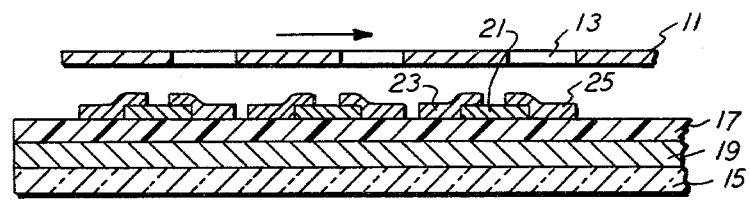

The shadow mask 11 having openings 13 therein is now moved 180° with respect to the initial movement a distance of about twice the initial movement and another deposition similar to that described with respect to FIG. 4B is conducted. The configuration of the device at this stage is shown in FIG. 4C wherein conductive areas 25 are deposited through openings 13 in the shadow mask 11 to form a pad similar in nature to the pad 23 previously formed. Thus, when one of the conductive pads, for example, 23 is utilized as the source of the thin film transistor and the other pad 25 as the drain, the conductive channel in the semiconductive pad 21 lies between the two electrodes.

In one embodiment of the process in accordance with this invention, the shadow mask 11 is next moved back to its original position and the substrate bearing the previously formed depositions thereon is moved away from the shadow mask. An insulating material such as any of those previously enumerated with regard to layer 17 is deposited through the openings 13. Because the mask is a distance from the substrate, the material passing through the openings 13 spreads out and forms insulating pads over the total area of the semiconductive pads 21 and the portion of the contacts 23 and 25 overlapping the semiconductive layer 21.

Figure 5:
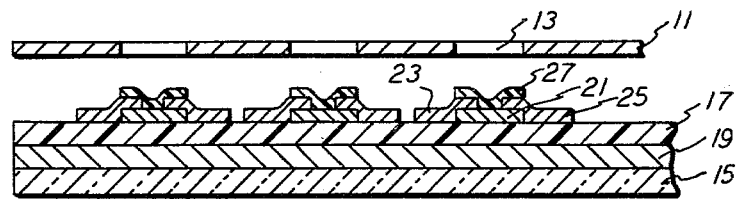
FIG. 5 is a schematic cross-sectional illustration of one embodiment of the substrate being processed in accordance with this invention.
Figure 6:
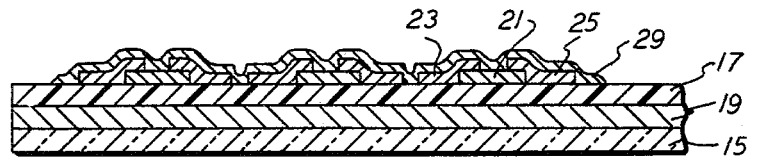
FIG. 6 is an alternate embodiment of a cross-sectional illustration of the substrate being processed in accordance with this invention.

In an alternate embodiment as shown in FIG. 6, the mask 11 is removed from the position between the source of material and the substrate 15 and a uniform layer of insulating material 29 is deposited over the structure as shown in FIG. 4C. In the case of the configuration of both FIGS. 5 and 6, the substrate 15 bearing the deposited layers, in accordance with the procedure set forth above, is next removed from the vacuum chamber and processed by conventional photolithographic techniques in order to form the drain pads, source bus conductors, crossover insulator pads, gate insulator pads, the gate electrodes and the gate bus conductors.

Referring once again to the configuration of FIG. 5, the layer 27 previously deposited during the single vacuum pump-down may be employed as the gate insulator or an additional layer of an insulating material may be deposited over this layer by photolithographic techniques. That is, a suitable photoresist material such as Shipley AZ 1350 J sold by Shipley Co., Inc., Newton, Mass., can be uniformly coated over the structure of that shown in FIG. 5 and photographically exposed to render the areas immediately over insulative pads 27 more soluble than the remainder of the photoresist. This photoresist is then dissolved away and an insulating layer deposited by any conventional method including the deposition of a resinous insulative layer from a solution thereof, the re-insertion of the device into a vacuum chamber with the subsequent deposition by either evaporation or sputtering, followed by the removal of the device from the vacuum and removal of the remainder of the resist by solvent action.

The configuration of FIG. 6 can be processed in a like manner wherein a photoresist is applied over the structure as shown in FIG. 6. The areas of the photoresist covering unwanted portions of the uniform insulating layer 29 are rendered more soluble than the areas corresponding to insulating areas 27 of FIG. 5 and are removed by solvent action. The exposed portions of the uniform insulating layer 29 are thereafter etched away by use of a suitable solution therefor. Subsequently, the remaining portion of the resist covering the wanted areas of layer 29 are removed. This, of course, can be accomplished by two techniques, one utilizing a photoresist which cross-links upon exposure and, in this technique, the wanted areas are exposed by photographic methods. Further, if a photoresist which degrades upon exposure is employed, the unwanted areas are exposed and then subsequently removed. Both types of resist are well known in the photolithographic art and require no further discussion here.

Subsequent to the delineation of the insulative insulator which has the appearance of insulator 27, shown in FIG. 5, by either of the two techniques indicated above, the source electrodes, considered hereinafter as the conductive electrode 23 in any given row or column, are connected to a common bus conductor 31 of FIG. 7. One example of a manner of forming the bus conductors for both the source electrodes and the gate electrodes is the photolithographic technique followed by the deposition of a conductive material in the portions not masked by the resist. Thus, in FIG. 7, bus conductors 31 would be prepared by applying a uniform coating of a resist over the entire surface of the array, exposure of the resist to a light pattern, removal of the resist in the areas indicated by reference character 31, deposition of a suitable conductive material in the areas unoccupied by the resist and removal of the remaining resist material therefrom. If desirable, drain pads 39, which electrically engage drain electrodes 25, may be formed simultaneously with the formation of source bus conductors 31.

Figure 7:
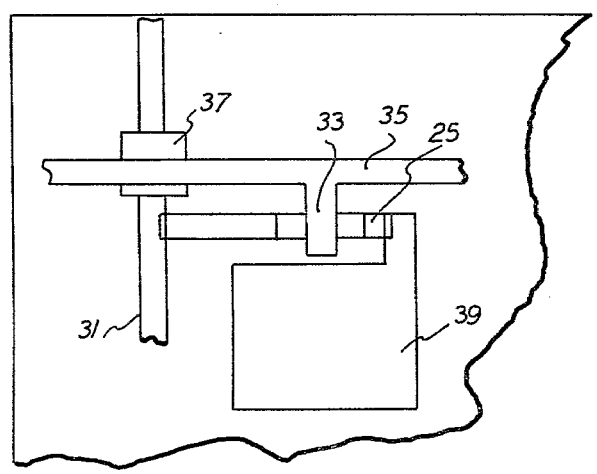
FIG. 7 is a top view of a single thin film transistor of the array showing the connections to the various electrode members.

It should be understood that in the discussion contained herein when rows and columns are mentioned with respect to the bus conductors for both the source electrodes 23 and the gate electrodes 33 connected to the gate bus conductors 35 as shown in FIG. 7 that a matrix of the source bus conductors and the gate bus conductors transverse to the source bus conductors is contemplated wherein a single transistor of the array can be addressed. By the expressions, rows and columns, nothing is intended to imply that either the rows or columns are disposed vertically or horizontally.

Following the deposition of the conductive material forming source conductive buses 31, insulating pads 37 are delineated and deposited in the crossover areas where the gate bus conductors 35 will cross over the source bus conductors 31. An additional layer of insulating material, if desired, may be simultaneously deposited over insulating pads 27 to serve as the gate insulator. These insulating areas, once again, can be formed by the photolithographic technique wherein a resist is uniformly applied, removed in the areas wherein the insulating material is desired and subsequently the insulating material is applied thereto with the subsequent removal of the resist material from the remaining portion of the structure. Finally, in another photolithographic step, both the gate electrodes 33 and the gate bus conductors 35 are formed wherein the gate electrode 33 is deposited and disposed over the insulating material 27. If desired, at this time, drain pads 39 in electrical contact with drain electrodes 25 may be deposited simultaneously with the gate electrodes 33 and gate bus conductors 35. The drain pads 39 have a significantly larger area than the area of the thin film transistor. Where the thin film transistor array is being used to drive an electro-optical display such as, for example, a liquid crystal display or an electroluminescent display, it is desirable that the drain electrode form one of the electrodes of the electro-optical display and therefor should be larger in size than the drain formed herein. Thus, drain pad 39 may be formed by a photolithographic technique similar to those described above for delineating the areas mentioned above.

Figure 8:
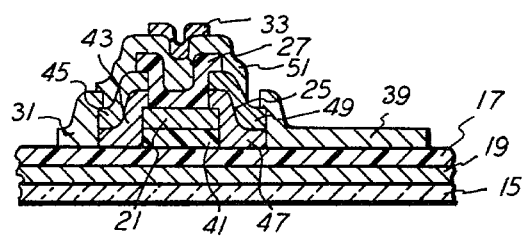
FIG. 8 is a schematic cross-sectional view of a thin film transistor fabricated by the method in accordance with this invention.

FIG. 8 is a schematic representation of a completed thin film transistor made in accordance with a preferred embodiment of this invention. A glass substrate 15 which has been previously cleaned by washing, degreasing and rinsing several times with de-ionized water is inserted into a vacuum chamber and the vacuum pumped down to $2 \times 10^{-7}$ torr. A uniform layer of about 1,000 Angstroms thickness of aluminum 19 is evaporated onto the glass substrate 15. Next, a uniform layer of aluminum oxide 17 ($Al_2O_3$) is evaporated over the surface of the aluminum layer 19. This layer has a thickness of about 4,000 Angstroms. As the vacuum system employed herein has no facility for moving a shadow mask 11 into position, the vacuum is broken, the mask installed and the vacuum re-established. A 1,000 Angstrom layer 41 of $Al_2O_3$ is evaporated through the openings 13 in the mask 11 followed by a layer 21 of cadmium selenide of approximately 80 Angstroms thick to form the pads of semiconductive material 21 also illustrated in FIGS. 4A through 7. Insulating layer 41 provides a new clean surface for the deposition of the semiconductor layer 21. The shadow mask is next moved in a longitudinal direction with respect to the openings 13 in mask 11 a distance of 2.5 mils and a layer of 100 Angstroms thickness of indium 43 is evaporated through the openings 13 in the shadow mask 11. Secondly, while the mask is in the same position, a layer 45 of gold of 1,000 Angstroms thickness is evaporated through the shadow mask. Together, layers 43 and 45 form the source electrode 23 shown in FIGS. 4B–5. The shadow mask is next moved in a direction 180° with respect to the initial movement a distance of 5 mils and a similar layered structure of 100 Angstroms of indium 47 and 1,000 Angstroms of gold 49 is evaporated through the openings 13 in the shadow mask 11. Together, layers 47 and 49 form drain electrode 25 shown in FIGS. 4C–5. The shadow mask is moved back to its starting position and a layer 27 of about 1,000 Angstroms thickness of aluminum oxide is deposited over the surface of the exposed cadmium selenide layer. The structure thus prepared is now removed from the vacuum and the shadow mask 11 is removed. The substrate containing the previously prepared assembly of layers is once again re-inserted into the vacuum and the vacuum pumped down to the level expressed above. A 1,000 Angstrom layer of nickel is uniformly coated over the entire assembly and the assembly once again removed from the vacuum. A uniform layer of a photoresist sold under the trade designation Shipley AZ 1350 J by Shipley Co., Inc., of Newton, Mass., is spin coated over the surface of the nickel layer and exposed photolithographically to delineate the source bus conductors 31 and the drain pads 39 which contact the source electrode shown as layers 43 and 45 and the drain electrode shown as layers 47 and 49, respectively, of each thin film transistor of the array. The nickel is then etched away in the unwanted areas utilizing a solution of 6 parts of water and 1 part of nitric acid. The remaining portions of the photoresist are removed by soaking in acetone solution and then drying. Once again, a layer of the photoresist is applied to the surface and exposed in order to delineate the crossover insulator area 37 shown in FIG. 7 and the areas of 51 which will become the remainder of the gate insulator. The photoresist in the exposed areas is washed away, the substrate placed in vacuum once again and a layer 51 of 3,000 Angstroms thick aluminum oxide is evaporated over the surface. The substrate is then once again removed from the vacuum and soaked in acetone in order remove the remaining portion of the photoresist containing the aluminum oxide on top of it. Finally, the substrate is once again placed in the vacuum and a uniform layer of 1,000 Angstroms of aluminum is deposited over the structure. The substrate is removed from the vacuum and the gate electrode 33 and the gate bus conductors are delineated by utilizing a photoresist in a manner similar to that set forth above and the unwanted portions of aluminum are etched away. The portions of the photoresist remaining are then dissolved utilizing acetone thus completing the preparation of the entire thin film transistor structure.

Finally, it may be desirable to anneal the completed thin film transistor array, such as by heating in a non-oxidizing atmosphere such as nitrogen for about 10 hours at about 350° C.

Although the invention has been described in considerable detail in the foregoing, it is to be understood that such detail is solely for the purpose of illustration and that many variations in the thin film transistor arrays and the process described herein can be made by those skilled in the art without departing from the spirit and the scope of the invention as set forth in the claims.

What is claimed is:

1. In a process for the preparation of a thin film transistor array including a plurality of thin film transistors, each transistor having a source electrode, a drain electrode and an insulated gate electrode positioned with respect to a semiconductor pad, said plurality of thin film transistors arranged in rows and columns, each source electrode of each transistor in any given row being connected to a common bus conductor, each gate of each transistor in any given column being connected to a common bus conductor to form a matrix whereby any given transistor of the array can be addressed, each transistor having at least the interface of the semiconductor pad with the next adjacent subsequently deposited layers formed in a single vacuum pump-down, the improvement which comprises forming the semiconductor pads by depositing a semiconductor material through a mask having openings therein commensurate to the size, shape and relative position of the semiconductive pads to be deposited, moving the mask in a first direction parallel to the longest dimension of the openings therein a distance of from about $\frac{2}{8}$ to about $\frac{3}{8}$ of the longest dimension of the openings, depositing a conductive material through the openings in the mask to form a first electrical contact to each semiconductive pad, moving the mask in a direction 180° with respect to said first direction a distance of about twice the distance of the initial movement and depositing a conductive material through the openings in the mask to form a second electrical contact to each semiconductive pad, depositing an insulating layer over at least the areas occupied by the semiconductor pads, removing the prepared structure from vacuum, applying discrete areas of conductive material over the insulating layer to form the gate electrode of each transistor of the array and forming the source bus conductors and the gate bus conductors.

2. The process of claim 1 wherein the semiconducting pads are applied to a substrate.

3. The process of claim 2 wherein the semiconductor pads are deposited onto an insulating layer previously applied to a substrate in the same vacuum pump-down.

4. The process of claim 1 wherein the semiconductor pads are deposited onto an insulating layer applied over a uniform layer of a conductor disposed on a substrate.

5. The process of claim 4 wherein the conductive layer is applied to the substrate in the same vacuum pump-down.

6. A process for the preparation of a thin film transistor which comprises positioning a substrate in a vacuum chamber, pumping down the vacuum chamber, depositing a layer of an insulating material on the substrate, forming the semiconductor pad by depositing a semiconductor material through a mask having an opening therein, moving the mask in a first direction parallel to the longest dimension of the opening therein a distance of from about $\frac{2}{8}$ to about $\frac{3}{8}$ of the longest dimension of the opening, depositing a conductive material through the opening in the mask to form a first electrical contact to the semiconductive pad, moving the mask in a direction 180° with respect to said first direction a distance of about twice the distance of the initial movement and depositing a conductive material through the opening in the mask to form a second electrical contact to the semiconductive pad, depositing an insulating layer over the conductive layers and the semiconductor pad and applying a conductive gate electrode over the insulating layer.

* * * * *